United States Patent [19]

Ohtaki et al.

[11] Patent Number: 4,633,496
[45] Date of Patent: Dec. 30, 1986

[54] LOW-PASS FILTER CIRCUIT

[75] Inventors: Kiyoshi Ohtaki; Kohji Ishida, both of Tokyo, Japan

[73] Assignee: Pioneer Electronic Corporation, Japan

[21] Appl. No.: 630,607

[22] Filed: Jul. 13, 1984

[30] Foreign Application Priority Data

Jul. 30, 1983 [JP] Japan .................................. 58-139853

[51] Int. Cl.⁴ ................................................ H04H 5/00
[52] U.S. Cl. ............................................ 381/4; 381/13
[58] Field of Search .............................. 381/3, 4, 7, 13

[56] References Cited

U.S. PATENT DOCUMENTS 4,386,235  5/1983  Naito ........................................ 381/7
4,569,072  2/1986  Van Roermand ...................... 381/13

Primary Examiner—Forester W. Isen
Attorney, Agent, or Firm—Sughrue, Mion, Zinn, Macpeak, and Seas

[57] ABSTRACT

A low-pass filter circuit for suppressing a subcarrier contained in an FM stereo demodulation signal in which the output signal of the circuit is unaffected by magnetic distortion. The FM stereo demodulation signal is applied through a low-pass filter to n sample-and-hold circuits connected in parallel with one another. The outputs of the sample-and-hold circuits are summed to form an output signal in which the subcarrier signal has been suppressed. The n sample-and-hold circuits are driven with a corresponding number of sampling pulse signals of different phases.

4 Claims, 9 Drawing Figures

LOW-PASS FILTER CIRCUIT

BACKGROUND OF THE INVENTION

The present invention relates to an LPF (low-pass filter) circuit for suppressing an unwanted subcarrier in an FM stereo demodulation output.

A conventional LPF circuit of this type is shown in FIG. 1. In FIG. 1, a composite stereo signal applied to an input terminal 1 is supplied to one input terminal of an adder 6, one input terminal of an adder 7, a 38 KHz oscillator 3 and one input terminal of a multiplier 4. The output of the 38 KHz oscillator 3 is applied to the other input terminal of the multiplier 4. The output of the multiplier 4 is applied to the other input terminal of the adder 7. The output of the adder 6 is applied to the input terminal of an LPF 8 including an inductance L and a capacitance C. The output of the LPF 8 is provided as a left channel output at a left channel output terminal 10. On the other hand, the output of the adder 7 is supplied to the input terminal of an LPF 9 including an inductance L and a capacitance C, similar to the case of the LPF 8. The output of the LPF 9 is provided as a right channel output at a right channel output terminal 11. The adders 6 and 7, the 38 KHz oscillator 3, the multiplier 4 and the inverter 5 form a stereo demodulator 2.

In the circuit thus constructed, the composite stereo signal applied to the input terminal 1 is represented by:

$$(L+R)+(L+R)+(L-R) \sin \omega_c t, \quad (1)$$

where $\omega_c$ is the carrier frequency. In order to form the right and left signals R and L by the use of the composite signal, the 38 KHz subcarrier is multiplied by the composite signal. In the 38 KHz oscillator, a PLL or the like is employed to form the 38 KHz subcarrier by using a 19 KHz pilot signal included in the composite signal. When the output $\sin \omega_c t$ of the 38 KHz oscillator 3 is multiplied by the composite signal, the following expression is obtained:

$$(L-R)+(L+R) \sin \omega_c t-(L-R) \cos 2\omega_c t \quad (2)$$

The sum of the expressions (1) and (2) is the output of the adder 6, which can be represented by the following expression:

$$2L+(3L+R) \sin \omega_c t-(L-R) \cos 2\omega_c t \quad (3)$$

This output of the adder 6 is applied to the filter 8, whose cut-off frequency is 15 KHz, as a result of which the left channel signal is provided at the output terminal 10.

The difference between expressions (1) and (2) is the output of the adder 7. Therefore, the output of the adder 7 can be represented by the following expressions:

$$2R+(-L-3R) \sin \omega_c t+(L-R) \cos 2\omega c t \quad (4)$$

As in the above-described case, the output of the adder 7 is applied to the LPF 9, as a result of which the right channel signal is provided at the output terminal 11.

As described above, the conventional circuit for removing the unwanted subcarrier from the output uses LPFs which are made up of capacitors and inductors. With this construction, the signal is deteriorated when passing through the LPF. The deterioration of the signal is attributed mainly to magnetic distortion caused by the core material of the inductor in the LPF.

SUMMARY OF THE INVENTION

Accordingly, an object of the present invention is to eliminate the above-described difficulty accompanying a conventional low-pass filter circuit.

In accordance with the above and other objects the invention provides a low-pass filter circuit in which, instead of the inductor and the capacitor used in the conventional arrangement, sample-and-hold circuits are employed to obtain the desired R and L components from the signals outputted by the adders 6 and 7 in FIG. 1.

DESCRIPTION OF THE PREFERRED EMBODIMENTS

A preferred embodiment of the invention will be described with reference to the drawings. In the circuit shown in FIG. 2, a demodulator output is applied through an LPF 12 to the input terminals of n sample-and-hold circuits 13 (n being an integer larger than one). The sample-and-hold circuits 13 are parallel connected, and the outputs of the circuits 13 are applied to respective inputs of an adder 14. An output signal is provided at the output terminal of the adder 14. Each sample-and-hold circuit 13 is composed of an analog gate $S_n$, a capacitor $C_n$, a resistor $R_n$ and a buffer amplifier $A_n$. The analog gates $S_n$ are driven by n sampling pulse signals $S_1$ through $S_n$ of different phases, which are formed from a clock pulse signal CK, as shown in FIG. 3.

Figure 4:
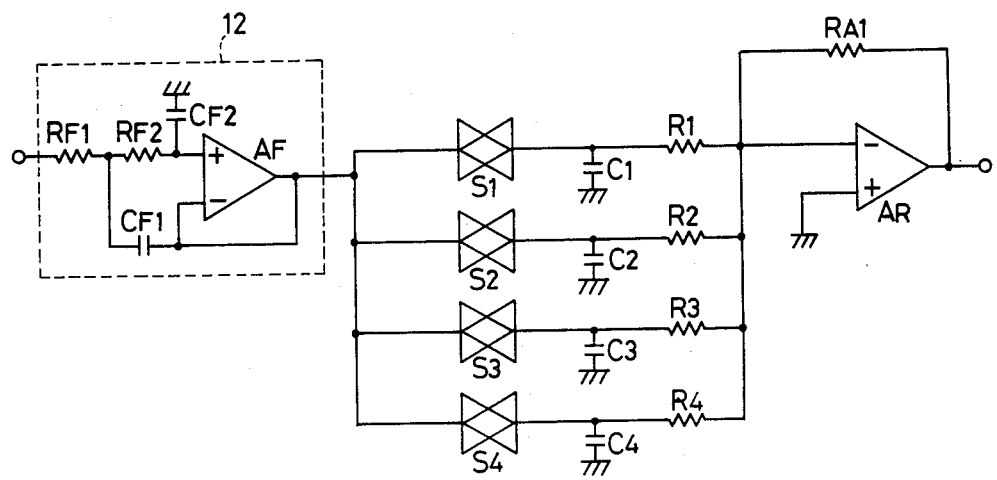
FIG. 4 is a circuit diagram, partly as a block diagram, showing a second example of an LPF circuit according to the invention in which n=4.
Figure 5:
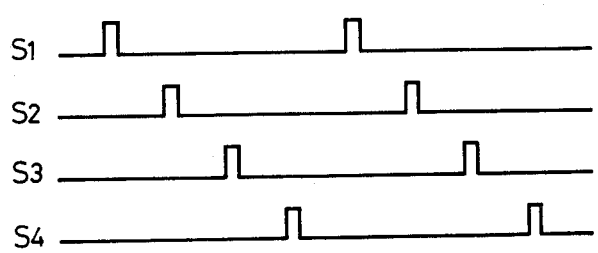
FIG. 5 is a timing chart showing sampling pulse signals for driving the sample-and-hold circuits shown in FIG. 4.

In the case of FIG. 4, n=4. The LPF 12 is composed of resistors $R_{F1}$ and $R_{F2}$, capacitors $C_{F1}$ and $C_{F2}$ and an operational amplifier $A_F$. The analog gates $S_1$ through $S_4$ are driven by four sampling pulse signals as shown in FIG. 5.

Figure 6:
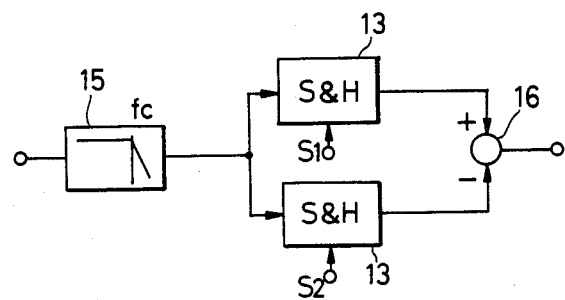
FIG. 6 is a circuit diagram, partly as a block diagram, showing a third example of an LPF circuit according to the invention in which n=4.
Figure 7:
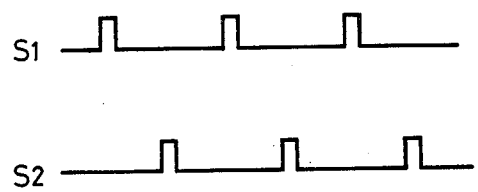
FIG. 7 is a timing chart showing sampling pulse signals for driving the circuit in FIG. 6.

In the case of FIG. 6, n=2. The stereo demodulator output is applied through an LPF 15 to two sample-and-hold circuits 13. The outputs of the circuits 13 are applied to an adder 16, and an output signal is provided at the output terminal of the adder 16. The sample-and-hold circuits 13 are driven by two sampling pulse signals as shown in FIG. 7.

Figure 8:
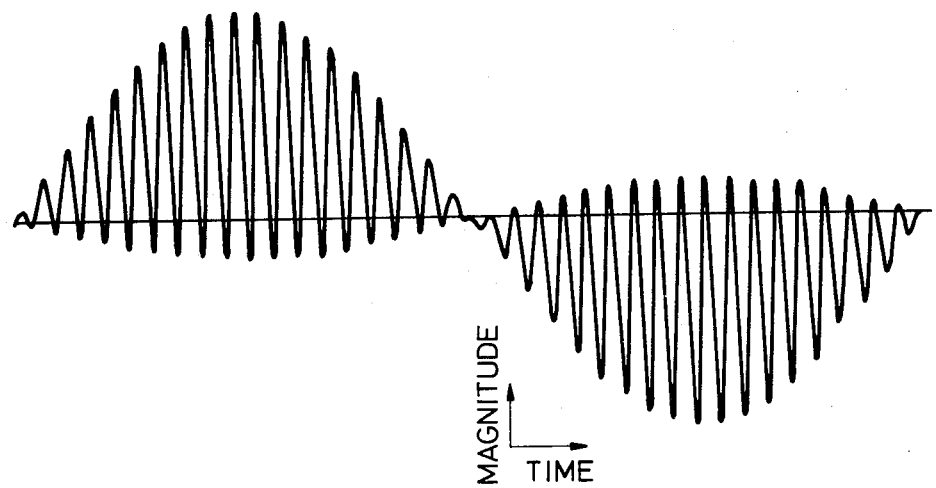
FIG. 8 is a diagram showing the output waveform of a stereo demodulation signal.
Figure 9:
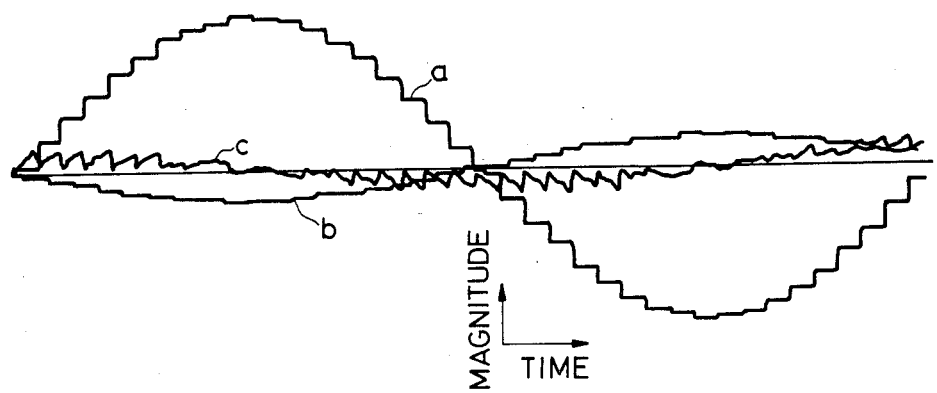
FIG. 9 is a waveform diagram, in which (a) and (b) designate waveforms which are provided by sampling and holding the signal of FIG. 8 with the circuit of FIG. 2, and (c) designates error components which are obtained by subtracting signal components from the sum of the waveforms (a) and (b).

The operation of the low-pass filter circuit according to the invention will be described. First, the case where n=2 as shown in FIG. 6 will be considered. The stereo demodulator output $(2L+(3L+R)\cdot\sin\omega_c t)$ can be plotted as shown in FIG. 8, in which the horizontal axis represents time and the vertical axis magnitude. When a clock pulse of 76 KHz is used, a waveform (a) as shown in FIG. 9 is obtained by sampling and holding the signal of FIG. 8 with the sampling pulse signal $S_1$, and a waveform (b) as shown in FIG. 9 is obtained by sampling and holding the signal with the sampling pulse signal $S_2$. Addition of the waveforms (a) and (b) provides an output waveform.

As is apparent from FIG. 9, the circuit shown in FIG. 6 provides an output in which the subcarrier has been suppressed. That is, even if the input signal varies during the holding period, the variation will not appear in the output, and components whose frequencies are higher than half that of the clock pulse signal CK are suppressed. In FIG. 9, (c) designates the waveform which represents the values which are obtained by subtracting the original L signal (a 1 KHz sinusoidal wave in this case) from the sum of the waveforms (a) and (b), that is, the error components which remain after the subcarrier has been suppressed.

In the above described operation, it should be noted that the cut-off frequency $f_c$ of the LPF 15 is 53 KHz. Therefore, the amount of cancellation is 21.15 dB in effective value. In the case of n=4, the same technical concept is applicable. That is, the four sample-and-hold circuits are driven by the four sampling pulse signals in such a manner that the error components indicated by the waveform (c) in FIG. 9 are reduced. In this case, the frequency of the clock pulse signal CK is 15.2 KHz=38 KHz×4.

Figure 1:
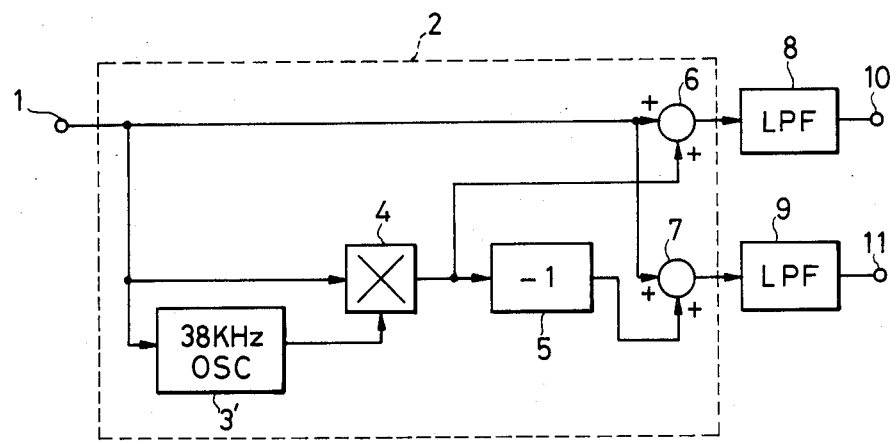
FIG. 1 is a block diagram showing a conventional LPF circuit in which LPFs having a cut-off frequency $f_c = 15$ KHz are used for suppressing a subcarrier.
Figure 2:
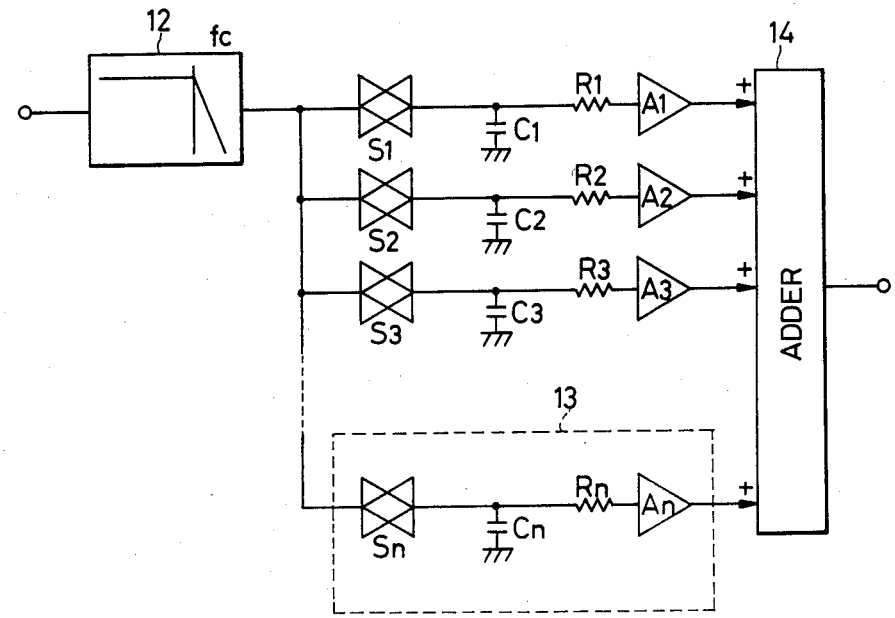
FIG. 2 is a circuit diagram, partly as a block diagram, showing a subcarrier suppressing circuit using a first example of an LPF filter circuit according to the invention.
Figure 3:
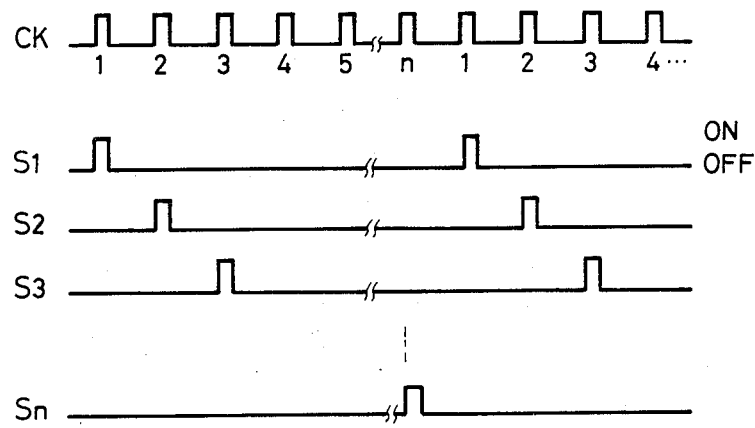
FIG. 3 is a timing chart showing sampling pulse signals used for driving the sample-and-hold circuits shown in FIG. 2.

In general, driving the n sample-and-hold circuits with the n sampling pulse signals as shown in FIG. 2 can set the cut-off frequency of the LPF 12 to a sufficiently high value and prevent a beat which occurs if the clock pulse frequency is close to the input signal frequency. For instance, if the clock pulse frequency is set to 304 KHz when n=8, then a filter having a cut-off frequency of the order of 280 KHz may be employed, and in the case of an FM tuner, the LPF 12 can be eliminated because of the presence of the IF filter. The error components indicated by the waveform (c) in FIG. 9 can be reduced by increading n.

In the above-described embodiments, the frequency of the sampling pulse signals is equal to the subcarrier frequency 38 KHz. However, even if they are somewhat different from each other, the same effect can be obtained.

In the circuit of the invention, the input-output frequency characteristic changes with the clock pulse frequency. Therefore, the circuit may be used as a filter whose cut-off frequency can be freely changed.

As described above, the circuit of the invention employs sample-and-hold circuits in order to suppress the unwanted subcarrier included in the stereo demodulator output. Therefore, the circuit of the invention prevents the deterioration of sound quality which is caused by magnetic distortion of the core material of an inductor as in the conventional circuit.

Since the filter characteristic is determined according to the sampling frequency, the circuit is very little affected by variations in the characteristic of the various circuit elements, and therefore the circuit can be used without adjustment.

Furthermore, the sample-and-hold circuits can be readily provided in the form of an integrated circuit, and therefore the LPF filter circuit can be realized in the form of an integrated circuit. The circuit of the invention can be effectively used as an LPF filter circuit, for instance, in a compact disc player.

We claim:

1. A circuit for receiving and demodulating an FM stereo composite signal comprising:

demodulator means for demodulating an FM stereo composite signal to produce a first demodulated signal which includes the left channel signal and signals at the subcarrier frequency and at least one of its harmonics, and a second demodulated signal which includes the right channel signal and signals at the subcarrier frequency and at least one of its harmonics;

clocking pulse signal producing means for producing clock pulses at a frequency n times the subcarrier frequency, where n is an integer greater than one;

a set of n sample-and-hold circuits each of said sample-and-hold circuits connected to receive said first demodulated signal;

means for successively and cyclically applying a different one of said clocking pulses to each of said n sample-and-hold circuits so that each sample-and-hold circuit samples the first demodulated signal at the subcarrier frequency but at a different phase; and an adder for adding the sampled outputs of said n sample-and-hold circuits to produce at the output of the adder only the left channel signal, the signals at the subcarrier frequency and its harmonics being suppressed.

2. The circuit for receiving and demodulating an FM stereo composite signal of claim 1, wherein each of said sample-and-hold circuits comprises an analog gate having an input receiving said FM stereo demodulation signal, a resistor having a first terminal coupled to an output terminal of said analog gate, a capacitor coupled between said output terminal of said analog gate and a ground terminal, and an amplifier having an input coupled to a second terminal of said resistor, an output terminal of said amplifier being coupled to a respective input of said adder.

3. The circuit for receiving and demodulating an FM stereo composite signal of claim 2, further comprising a further low-pass filter for low-pass filtering said first demodulated signal before being applied to said inputs of said sample-and-hold circuits.

4. A circuit for receiving and demodulating an FM stereo composite signal as claimed in claim 1 further comprising:

another set of n sample-and-hold circuits each of said sample-and-hold circuits connected to receive said second demodulated signal;

another means for successively and cyclically applying a different one of said clocking pulses to each of said n sample-and-hold circuits so that each sample-and-hold circuit samples the first demodulated signal at the subcarrier frequency but at a different phase; and an adder for adding the sampled outputs of said n sample-and-hold circuits to produce at the output of said another adder only the right channel signal, the signals at the subcarrier frequency and its harmonics being suppressed.

* * * * *